United States Patent
Imam et al.

(10) Patent No.: US 11,942,542 B2
(45) Date of Patent: Mar. 26, 2024

(54) SEMICONDUCTOR DEVICE AND FABRICATION METHOD THEREOF

(71) Applicant: Vanguard International Semiconductor Corporation, Hsinchu (TW)

(72) Inventors: Syed-Sarwar Imam, Bihar (IN); Chia-Hao Lee, Hsinchu County (TW); Chih-Hung Lin, Hsinchu County (TW); Kun-Han Lin, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 90 days.

(21) Appl. No.: 17/489,730

(22) Filed: Sep. 29, 2021

(65) Prior Publication Data

US 2023/0100115 A1 Mar. 30, 2023

(51) Int. Cl.
*H01L 29/78* (2006.01)
*H01L 29/40* (2006.01)
*H01L 29/66* (2006.01)

(52) U.S. Cl.
CPC ........ *H01L 29/7816* (2013.01); *H01L 29/401* (2013.01); *H01L 29/402* (2013.01); *H01L 29/66681* (2013.01)

(58) Field of Classification Search
CPC . H01L 29/7816; H01L 29/401; H01L 29/402; H01L 29/66681
See application file for complete search history.

(56) References Cited

U.S. PATENT DOCUMENTS

| 7,750,401 B2 | 7/2010 | Cai |
| 10,050,115 B2 | 8/2018 | Brown |
| 2014/0131796 A1* | 5/2014 | Zhou .................. H01L 29/1083 438/286 |
| 2021/0376097 A1* | 12/2021 | Goto ................. H01L 29/66689 |
| 2022/0130964 A1* | 4/2022 | Fang ................. H01L 29/42368 |

FOREIGN PATENT DOCUMENTS

| TW | 200805510 | 1/2008 |
| TW | 201438065 A | 10/2014 |
| TW | 201839997 A | 11/2018 |

OTHER PUBLICATIONS

R. Sithanandam et al., Linearity and speed optimization in SOI LDMOS using gate engineering, Semiconductor Science and Technology 25 015006, IOP Publishing, pp. 1-6, Dec. 8, 2009.

* cited by examiner

*Primary Examiner* — Mohammed R Alam
(74) *Attorney, Agent, or Firm* — Winston Hsu

(57) ABSTRACT

A semiconductor device includes a substrate, a gate dielectric layer, a gate electrode, a field plate, a source electrode and a drain electrode. The gate dielectric layer is disposed on the substrate and includes a first portion having a first thickness, a second portion having a second thickness, and a third portion having a third thickness. The first, second and third thicknesses are different from each other, and the first thickness is smaller than the second and third thicknesses. The gate electrode is disposed on the first portion of the gate dielectric layer. The field plate is separated from and electrically coupled to the gate electrode, and is disposed on the second and third portions of the gate dielectric layer. The source and drain electrodes are disposed on the sides of the gate electrode and the field plate, respectively.

20 Claims, 10 Drawing Sheets

SEMICONDUCTOR DEVICE AND FABRICATION METHOD THEREOF

BACKGROUND OF THE INVENTION

1. Field of the Invention

The present disclosure relates generally to semiconductor devices, and more particularly to laterally-diffused metal-oxide semiconductor (LDMOS) devices and fabrication methods thereof.

2. Description of the Prior Art

An LDMOS device is MOS power transistor which includes a drift region between a gate and a drain region. The drift region is a lightly-doped region compared with the dopant concentration of the source and drain regions, which is used to avoid or suppress high electric fields between the source and drain regions. Since LDMOS devices are suitable for transmitting high-frequency and high-power electrical signal, they are widely used for high voltage power applications.

On-state resistance (Ron) is an important factor for a LDMOS device that is directly proportional to the power consumption of an LDMOS device. As there are increasing demands for power saving and better performance of electronic devices, manufacturers have continuously sought to reduce the current leakage and Ron of LDMOS devices. Although it has been observed that the Ron of the conventional LDMOS devices decreases when the dopant concentration of the drift region increases, the decreased Ron is usually achieved at the expense of reduced off-state breakdown voltage of the LDMOS devices. Thus, conventional LDMOS devices are able to deliver a high off-state breakdown voltage but fail to provide a low Ron.

SUMMARY OF THE INVENTION

In view of this, it is necessary to provide an improved semiconductor device to reduce on-state resistance without deficiencies related to the breakdown voltage and a method for fabricating the same.

According to one embodiment of the present disclosure, a semiconductor device is provided and includes a substrate, a gate dielectric layer, a gate electrode, a field plate, a source electrode and a drain electrode. The gate dielectric layer is disposed on the substrate and includes a first portion having a first thickness, a second portion having a second thickness, and a third portion having a third thickness. The first thickness, the second thickness and the third thickness are different from each other, and the first thickness is smaller than the second thickness and the third thickness. The gate electrode is disposed on the first portion of the gate dielectric layer. The field plate is disposed on the second portion and the third portion of the gate dielectric layer. The field plate is separated from and electrically coupled to the gate electrode. The source electrode is disposed on one side of the gate electrode. The drain electrode is disposed on one side of the field plate.

According to one embodiment of the present disclosure, a method of fabricating a semiconductor device is provided and includes the following steps. A substrate is provided and a gate dielectric layer is formed on the substrate. The gate dielectric layer includes a first portion having a first thickness, a second portion having a second thickness, and a third portion having a third thickness, where the first thickness, the second thickness and the third thickness are different from each other, and the first thickness is smaller than the second thickness and the third thickness. A gate electrode is formed on the first portion of the gate dielectric layer. A field plate is formed on the second portion and the third portion of the gate dielectric layer. The field plate is separated from and electrically coupled to the gate electrode. A source electrode is formed on one side of the gate electrode. A drain electrode is formed on one side of the field plate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
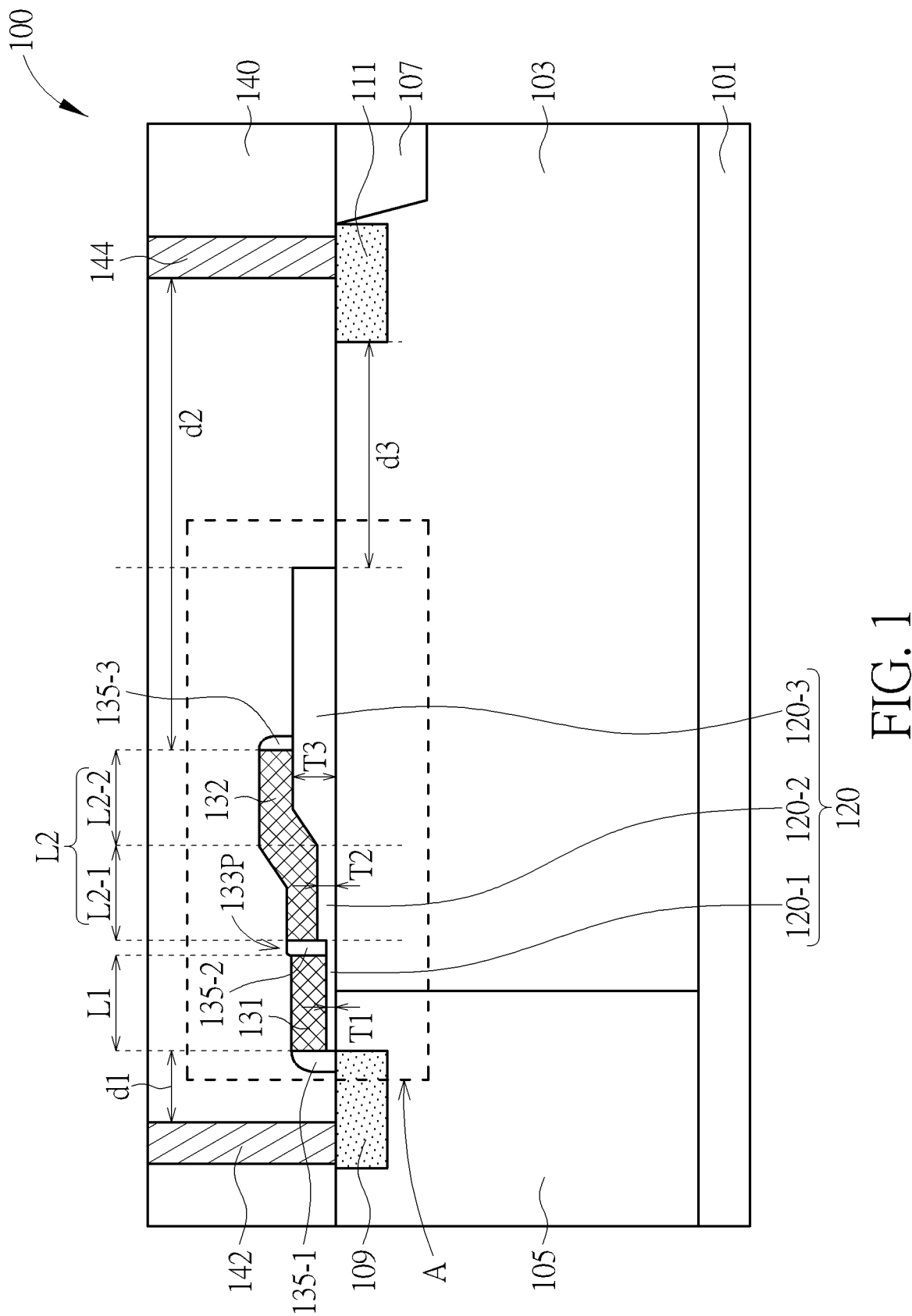
FIG. 1 is a schematic cross-sectional diagram of a semiconductor device according to one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "under", "on", "over", "above", "upper", "bottom", "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "under" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first", "second", and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that may vary as desired.

Although the disclosure is described with respect to specific embodiments, the principles of the disclosure, as defined by the claims appended herein, may obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to a semiconductor device such as a LDMOS field-effect transistor (FET) device and a method of fabricating the same. The semiconductor device includes a dual gate structure of a gate electrode and a field plate disposed on a triple step-shaped gate dielectric layer to achieve an optimum reduced surface field (RESURF) to reduce on-state resistance (Ron) and sustain threshold voltage and off-state breakdown voltage.

FIG. 1 is a schematic cross-sectional diagram of a semiconductor device according to one embodiment of the present disclosure. Referring to FIG. 1, in one embodiment, a semiconductor device 100 such as a LDMOS FET device includes a substrate 101. The substrate 101 may be a semiconductor substrate including elementary semiconductors such as Si and/or Ge; compound semiconductors such as GaN, SiC, GaAs, GaP, InP, InAs, and/or InSb; alloy semiconductors such as SiGe, GaAsP, AlInAs, AlGaAs, GaInAs, GaInP, GaInAsP, and/or a combination thereof. In addition, the substrate 101 may also be a silicon-on-insulator (SOI) substrate. In some embodiments, the substrate 101 has a first conductivity type, for example, P-type.

In addition, the semiconductor device 100 includes a well region 103 and another well region 105 disposed in the substrate 101 and near the top surface of the substrate 101. The well region 103 has a second conductivity type, for example, N-type, and the well region 105 has the first conductivity type, for example, P-type. The well region 105 may be referred to as a body region and the well region 103 may be referred to as a drift region. In one embodiment, the well region (body region) 105 is disposed adjacent to and in a direct contact with the well region (drift region) 103. The well region 103 and the well region 105 are individually formed by ion implanting the substrate 101 through a patterned mask such as a patterned photoresist. In some other embodiments, the first conductivity type is N-type, and the second conductivity type is P-type. The P-type dopants may include B, Ga, Al, In, $BF_3$ ions, or a combination thereof. The N-type dopants may include P, As, N, Sb ions, or a combination thereof. Since the dopant concentration of the well region (body region) 105 is at least 100 times greater than the dopant concentration of the well region (drift region) 103, the depletion region at the junction of the well regions 103 and 105 extends mostly in the well region (drift region) 103 and does not spread into a channel region formed in the well region (body region) 105.

Moreover, the semiconductor device 100 includes a source region 109 disposed in the well region 105 and a drain region 111 disposed in the well region 103. In some embodiments, the source region 109 and the drain region 111 are heavy doped regions of the second conductivity type, for example, $N^+$ regions. In addition, another heavy doped region (not shown in FIG. 1) of the first conductivity type, for example, a $P^+$ region may be disposed in the well region 105 and on the left side of the source region 109. The $P^+$ region is in a direct contact with the source region 109. In addition, as shown in FIG. 1, a shallow trench isolation (STI) 107 is disposed in the well region 103 near the drain region 111 to electrically isolate the adjacent devices from each other.

According to the embodiment of the present disclosure, as shown in FIG. 1, the semiconductor device 100 includes a gate dielectric layer 120 of a triple step-shaped structure in a cross-sectional view. The gate dielectric layer 120 includes a first portion 120-1 having a first thickness T1, a second portion 120-2 having a second thickness T2 and a third portion 120-3 having a third thickness T3. The first portion 120-1, the second portion 120-2 and the third portion 120-3 are connected with each other. The first thickness T1, the second thickness T2 and the third thickness T3 are different from each other. In detail, the first thickness T1 is smaller than the second thickness T2, and the second thickness T2 is smaller than the third thickness T3 (T1<T2<T3). In some embodiments, for example, the first thickness T1 may be 80 Angstroms, the second thickness T2 may be 160 Angstroms, and the third thickness T3 may be 460 Angstroms, but not limited thereto. Moreover, the step sidewalls of the gate dielectric layer 120 may be a vertical sidewall, a slanted sidewall or a combination thereof. The gate dielectric layer 120 may be silicon oxide, silicon nitride, silicon oxynitride or a combination thereof. The gate dielectric layer 120 may be formed by a deposition process such as a chemical vapor deposition (CVD) process, other applicable processes, or a combination thereof. In some embodiments, the gate dielectric layer 120 may be formed by several deposition processes.

In addition, the semiconductor device 100 includes a gate electrode 131 disposed on the first portion 120-1 of the gate dielectric layer 120 and a field plate 132 disposed on the second portion 120-2 and the third portion 120-3 of the gate dielectric layer 120. As shown in FIG. 1, the gate electrode 131 has a first length L1 and the field plate 132 has a second length L2, where the second length L2 is greater than the first length L1. In detail, a portion of the field plate 132 on the second portion 120-2 has a length L2-1 and another portion of the field plate 132 on the third portion 120-3 has a length L2-2. In some embodiments, the length L2-1 is substantially equal to the length L2-2. For example, in one embodiment, the first length L1 may be 0.25 μm, the length L2-1 may be 0.20 μm, and the length L2-2 may be 0.20 μm, i.e., the second length L2 may be 0.40 μm, but not limited thereto. In addition, the thickness of the field plate 132 may be the same as the thickness of the gate electrode 131. In some embodiments, the field plate 132 and the gate electrode 131 are formed from the same gate material layer. Thus, field plate 132 and the gate electrode 131 may be formed of the same material. In some embodiments, the material of the gate electrode 131 and the field plate 132 includes polysilicon, metal (e.g., tungsten, titanium, aluminum, copper, molybdenum, nickel, platinum, the like, or a combination thereof), metal alloys, metal-nitrides (e.g., tungsten nitride, molybdenum nitride, titanium nitride, tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other suitable materials, or a combination thereof. According to the embodiments of the present disclosure, the field plate 132 is laterally separated from the gate electrode 131 and electrically coupled to the gate electrode 131 through an interconnect structure (not shown in FIG. 1). Thus, the field plate 132 and the gate electrode 131 may have the same electric potential during the operation of the semiconductor device 100.

The gate electrode 131 is used to control the conductivity of a channel region underlying the gate electrode 131. The length of the channel region is defined by two boundaries, where one of the boundaries corresponds to the junction between the source region 109 and the well region 105, and the other one of the boundaries corresponds to the junction between the well 105 and the well 103.

Besides, since the thicknesses of the second portion 120-2 and the third portion 120-3 underlying the field plate 132 are greater than the thickness of the first portion 120-1 underlying the gate electrode 131, the electric field generated from the field plate 132 is used not to control the on-off state of the semiconductor device 100 but to control the electric field at the top surface of the well region 103.

As shown in FIG. 1, there is a gap 133P between the gate electrode 131 and the field plate 132. In some embodiments, the gap 133P may be directly above the first portion 120-1 of the gate dielectric layer 120. In addition, as shown in FIG. 1, in some embodiments, an edge of the field plate 132 is aligned with an edge of the second portion 120-2 of the gate dielectric layer 120.

Furthermore, the semiconductor device 100 includes a first gate spacer 135-1 disposed on one sidewall of the gate electrode 131, a second gate spacer 135-2 filled in the gap 133P between the gate electrode 131 and the field plate 132, and a third gate spacer 135-3 disposed on one sidewall of the field plate 132. The materials of the first gate spacer 135-1, the second gate spacer 135-2 and the third gate spacer 135-3 include silicon oxide, silicon nitride, silicon oxynitride, other suitable dielectric materials, or a combination thereof. The first gate spacer 135-1, the second gate spacer 135-2 and the third gate spacer 135-3 may be a single-layered or a multi-layered structure and may be formed at the same time.

As shown in FIG. 1, the semiconductor device 100 further includes an interlayer dielectric layer (ILD) 140 covering the substrate 101. The ILD 140 may include one or more layers of dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. The low-k dielectric materials may include, but are not limited to, fluorinated silica glass (FSG), hydrogen silsesquioxane (HSQ), carbon doped silicon oxide, amorphous fluorinated carbon, parylene, bis-benzocyclobutenes (BCB), or polyimide. The ILD 140 may be formed by a CVD process (e.g., a high-density plasma chemical vapor deposition (HDPCVD) process, an atmospheric pressure chemical vapor deposition (APCVD) process, a low-pressure chemical vapor deposition (LPCVD) process, or a plasma enhanced chemical vapor deposition (PECVD) process), a physical vapor deposition (PVD) process, an atomic layer deposition (ALD) process, a spin-on coating process, other applicable processes, or a combination thereof.

In addition, the semiconductor device 100 includes a source electrode 142 disposed in the ILD 140 and on one side of the gate electrode 131, and a drain electrode 144 disposed in the ILD layer 140 and on one side of the field plate 132. According to the embodiments of the present disclosure, there is a first distance d1 between the source electrode 142 and the gate electrode 131. There is a second distance d2 between the drain electrode 144 and the field plate 132. The second distance d2 is greater than the first distance d1. Each of the source electrode 142 and the drain electrode 144 may include a barrier layer and a conductive material. The barrier layer may be formed on the sidewall and the bottom of an opening in the ILD 140, and the conductive material fills in the opening. The material of the barrier layer may be TiN, Ti, Ta, TaN, W, WN, other suitable materials, or a combination thereof. The barrier layer may be formed by a PVD process (e.g., evaporation or sputtering), an ALD process, an electroplating process, other applicable process, or a combination thereof. The conductive material includes metal (such as W, Al, or Cu), metal alloys, polysilicon, other suitable conductive materials, or a combination thereof. The source electrode 142 and the drain electrode 144 may be formed by a PVD process, an electroplating process, an ALD process, other applicable process, or a combination thereof to deposit the conductive material, and then optionally performing a chemical mechanical polishing (CMP) process or an etching back process to remove extra conductive materials to form the source electrode 142 and the drain electrode 144.

Moreover, as shown in FIG. 1, according to the embodiments of the present disclosure, the third portion 120-3 of the gate dielectric layer 120 protrudes from the field plate 132 towards the drain electrode 144. In addition, there is a distance d3 between the third portion 120-3 of the gate dielectric layer 120 and the drain region 111. The distance d3 may be greater than the first distance d1 between the source electrode 142 and the gate electrode 131.

Figure 2:
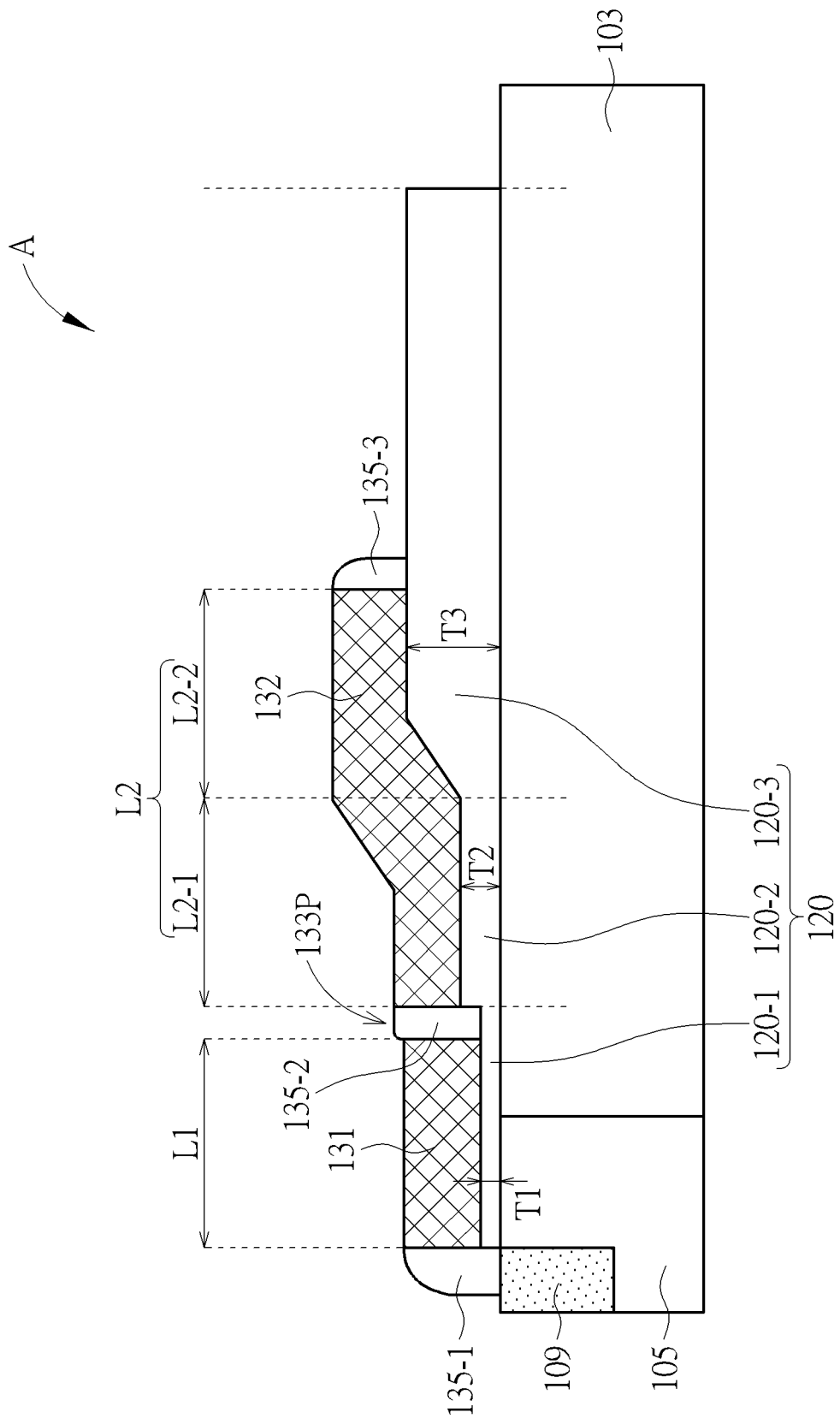
FIG. 2 is a schematic cross-sectional diagram of an area A of a semiconductor device as shown in FIG. 1 according to another embodiment of the present disclosure.

FIG. 2 is a schematic cross-sectional diagram of an area A of a semiconductor device 100 as shown in FIG. 1 according to another embodiment of the present disclosure. As shown in FIG. 2, in some other embodiments, the gap 133P between the gate electrode 131 and the field plate 132 may be directly above the second portion 120-2 of the gate dielectric layer 120. In some other embodiments, as shown in FIG. 2, an edge of the gate electrode 131 near the gap 133P may be aligned with an edge of the step of the second portion 120-2 of the gate dielectric layer 120. Another edge of the gate electrode 131 may be aligned with an edge of the step of the first portion 120-1 of the gate dielectric layer 120. In the embodiment, an edge of the field plate 132 near the gap 133P is back inwards from the edge of the step of the second portion 120-2 of the gate dielectric layer 120. The other features of the semiconductor device of FIG. 2 may be the same as those of the semiconductor device 100 of FIG. 1, and not repeated herein.

Figure 3:
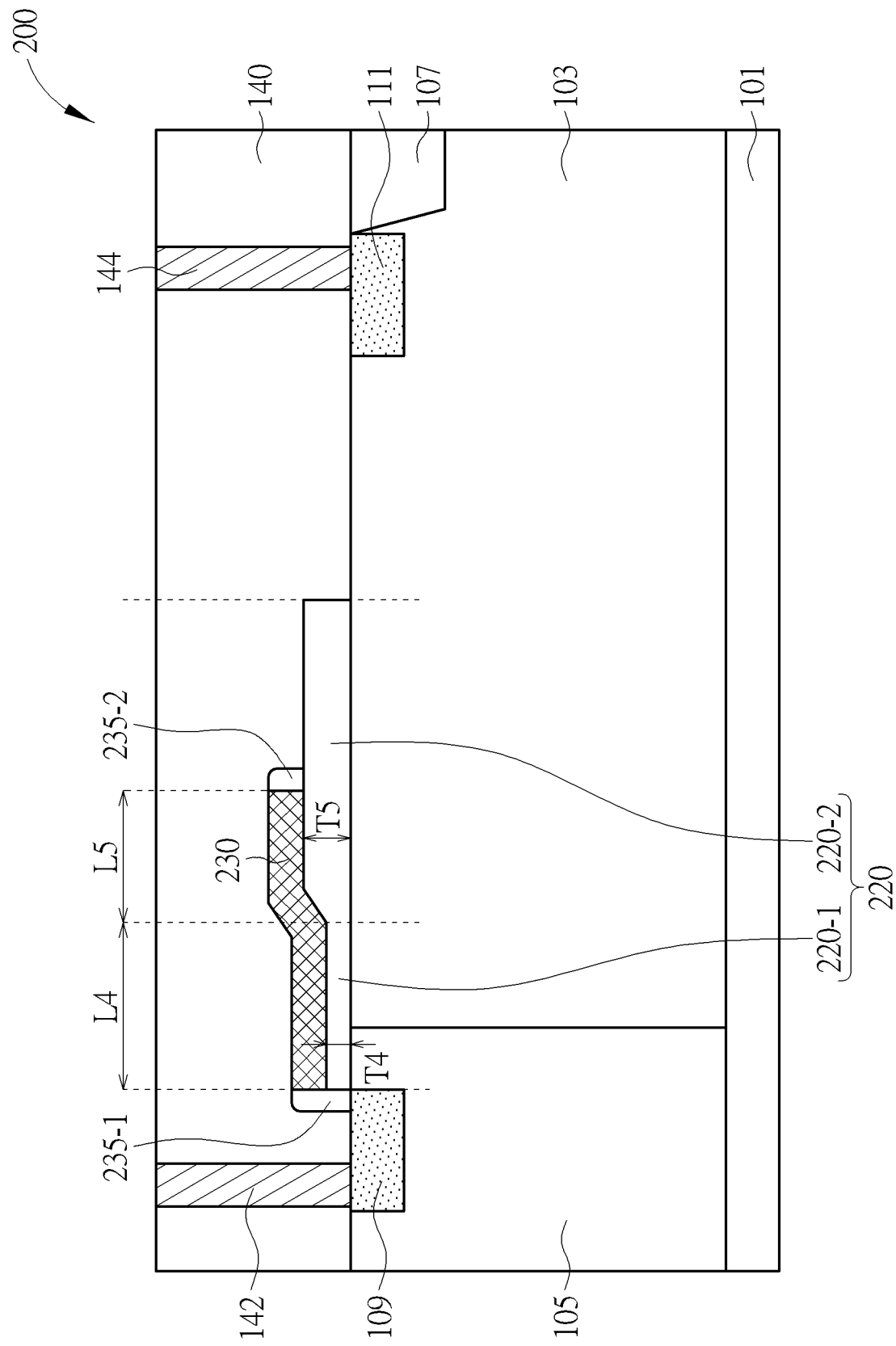
FIG. 3 is a schematic cross-sectional diagram of a semiconductor device according to a comparative example of the present disclosure.

FIG. 3 is a schematic cross-sectional diagram of a semiconductor device according to a comparative example of the present disclosure. As shown in FIG. 3, a semiconductor device 200 of a comparative example of the present disclosure includes a gate layer 230 disposed on a gate dielectric layer 220. The gate dielectric layer 220 includes a first portion 220-1 having a fourth thickness T4, and a second portion 220-2 having a fifth thickness T5, where the fourth thickness T4 is smaller than the fifth thickness T5. In one comparative example, for example, the fourth thickness T4 may be 102 Angstroms and the fifth thickness T5 may be 510 Angstroms. The gate layer 230 includes a first portion disposed on the first portion 220-1 of the gate dielectric layer 220, and a second portion disposed on the second portion 220-2 of the gate dielectric layer 220, where the first and second portions of the gate layer 230 are continuous without a gap therebetween. The first portion of the gate layer 230 has a fourth length L4 and is used as a gate electrode. The second portion of the gate layer 230 has a fifth length L5 and is used as a field plate. In one comparative example, for example, the fourth length L4 may be 0.4 µm and the fifth length L5 may be 0.3 µm. Moreover, a first spacer 235-1 and a second spacer 235-2 are disposed on two sidewalls of the gate layer 230 respectively. The other features of the semiconductor device 200 of FIG. 3 may be the same as those of the semiconductor device 100 of FIG. 1, and not repeated herein.

Figure 4A:
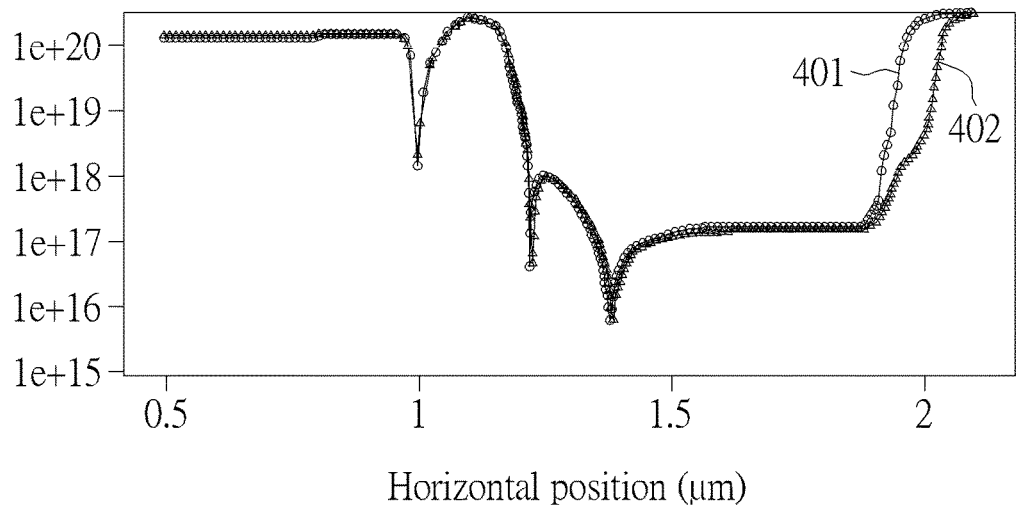
FIG. 4A shows doping concentration profiles along a horizontal direction of semiconductor devices according to a comparative example and one embodiment of the present disclosure.
Figure 4B:
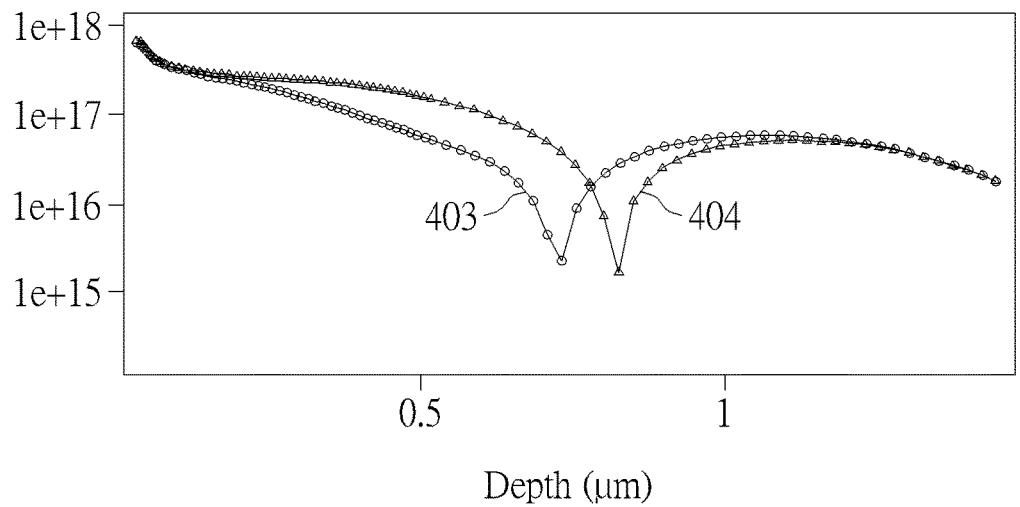
FIG. 4B shows doping concentration profiles along a vertical direction of semiconductor devices according to a comparative example and one embodiment of the present disclosure.

FIG. 4A and FIG. 4B show doping concentration profiles of semiconductor devices according to a comparative example and one embodiment of the present disclosure. As shown in FIG. 4A, a profile 401 is obtained from a semiconductor device according to one embodiment of the present disclosure, such as the semiconductor device 100 of FIG. 1. A profile 402 is obtained from a semiconductor device according to a comparative example of the present disclosure, such as the semiconductor device 200 of FIG. 3. In addition, the profiles 401 and 402 are taken along a horizontal cutline at the middle of a channel region of the semiconductor device 100 of FIG. 1 and the semiconductor device 200 of FIG. 3, respectively. The profiles 401 and 402 are doping concentrations varying with respect to different horizontal positions. When compared the profiles 401 and 402, it is observed that the doping concentration of the drift region of the semiconductor device 100 of one embodiment of the present disclosure is higher than the doping concentration of the drift region of the semiconductor device 200 of the comparative example.

As shown in FIG. 4B, a profile 403 is obtained from the semiconductor device 100 of FIG. 1, and a profile 404 is obtained from the semiconductor device 200 of FIG. 3. The profiles 403 and 404 are taken along a vertical cutline at the top surface of the substrate 101 and at the middle of the channel region of the semiconductor device 100 of FIG. 1 and the semiconductor device 200 of FIG. 3, respectively. The profiles 403 and 404 are doping concentrations varying with different depths. When compared the profiles 403 and 404, it is observed that the doping concentration of the drift region of the semiconductor device 100 of one embodiment of the present disclosure is higher than the doping concentration of the drift region of the semiconductor device 200 of the comparative example. In addition, the area of drift region of the semiconductor device 100 of one embodiment of the present disclosure is larger than area of the drift region of the semiconductor device 200 of the comparative example.

As shown in the doping concentration profiles of FIG. 4A and FIG. 4B, the doping concentration and the area of the drift region of the semiconductor device 100 according to the embodiments of the present disclosure are greater than these of the semiconductor device 200 of the comparative example. Therefore, the on-state resistance (Ron) of the semiconductor devices according to the embodiments of the present disclosure is decreased as a consequence of increased drift region doping which enhances the current flow and reduces the Ron.

Figure 5A:
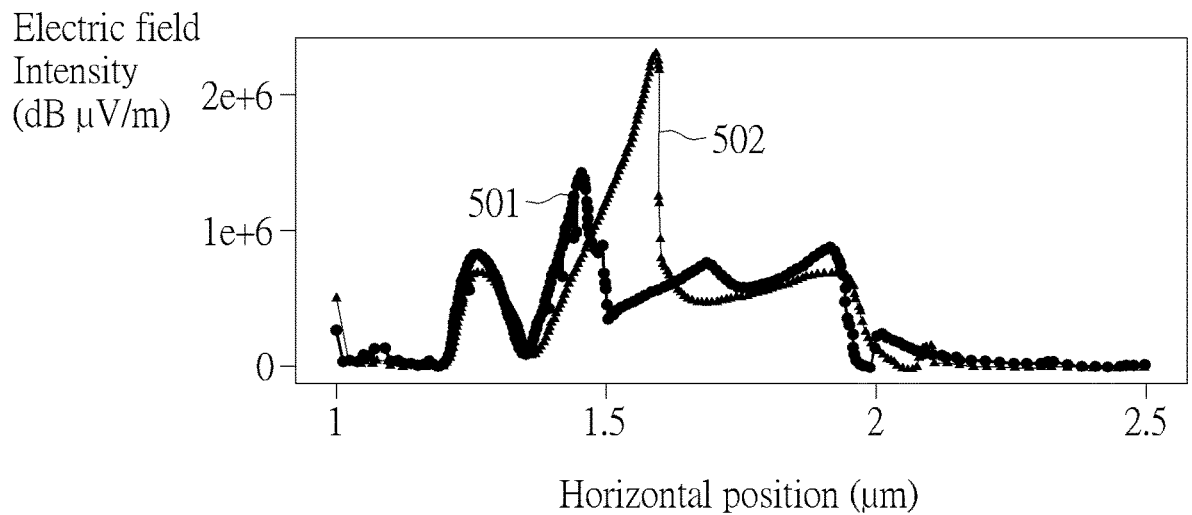
FIG. 5A shows electric field intensity profiles of semiconductor devices with a drain voltage of 14.4V according to a comparative example and one embodiment of the present disclosure.
Figure 5B:
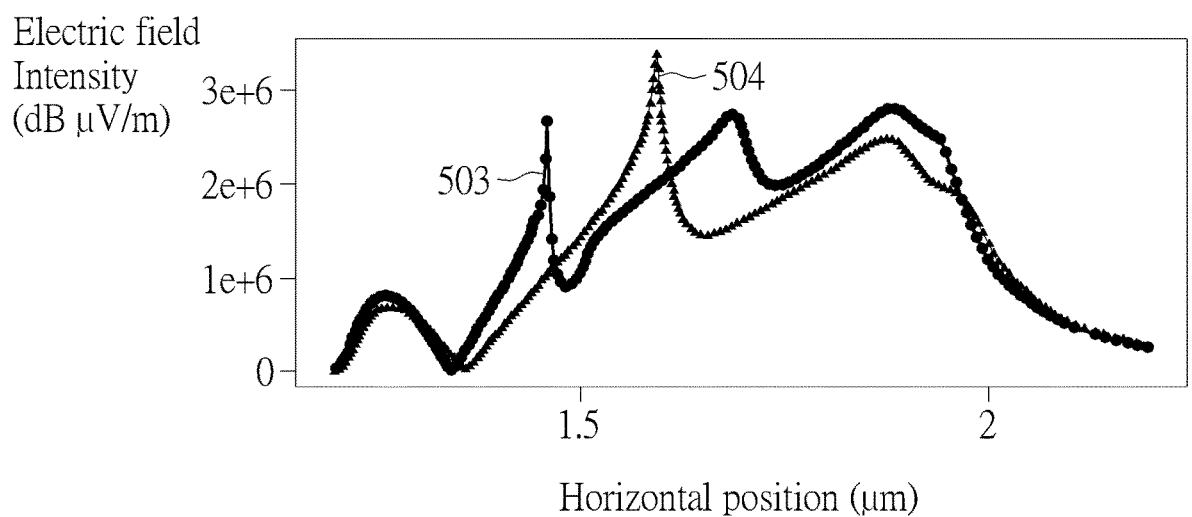
FIG. 5B shows electric field intensity profiles of semiconductor devices with a drain voltage of 20V according to a comparative example and one embodiment of the present disclosure.

FIG. 5A and FIG. 5B show electric field intensity profiles of semiconductor devices according to a comparative example and one embodiment of the present disclosure. As shown in FIG. 5A, a profile 501 is obtained from the semiconductor device 100 of FIG. 1 according to one embodiment of the present disclosure. A profile 502 is obtained from the semiconductor device 200 of FIG. 3 according to a comparative example of the present disclosure. In addition, the profiles 501 and 502 are taken along a horizontal cutline at the top surface of the substrate 101 of the semiconductor device 100 of FIG. 1 and the semiconductor device 200 of FIG. 3, respectively. The profiles 501 and 502 are electric field intensities varying with different horizontal positions at an operating voltage of 14.4V. When compared the profiles 501 and 502, it is observed that the highest surface electric field intensity of the semiconductor device 100 of the embodiment of the present disclosure is lower than the highest surface electric field intensity of the semiconductor device 200 of the comparative example.

As shown in FIG. 5B, a profile 503 is obtained from the semiconductor device 100 of FIG. 1 according to one embodiment of the present disclosure. A profile 504 is obtained from the semiconductor device 200 of FIG. 3 according to a comparative example of the present disclosure. The profiles 503 and 504 are also taken along a horizontal cutline at the top surface of the substrate 101 of the semiconductor device 100 of FIG. 1 and the semiconductor device 200 of FIG. 3, respectively. The profiles 503 and 504 are electric field intensities varying with different horizontal positions at an operating voltage of 20V. When compared the profiles 503 and 504, it is observed that the highest surface electric field intensity of the semiconductor device 100 of the embodiment of the present disclosure is also lower than the highest surface electric field intensity of the semiconductor device 200 of the comparative example which operate at a higher operating voltage than that of FIG. 5A.

As shown in the electric field intensity profiles of FIG. 5A and FIG. 5B, the surface electric field intensity of the semiconductor device 100 according to the embodiment of the present disclosure is lower than that of the semiconductor device 200 of the comparative example. The reduced surface electric field effect is achieved by the increased thickness T2 of the second portion 120-2 of the gate dielectric layer 120 over the drift region of the semiconductor device 100 according to the embodiments of the present disclosure. The thicker gate dielectric layer over the drift region releases the electric field distribution. Therefore, the on-state resistance (Ron) of the semiconductor devices according to the embodiments of the present disclosure is decreased as a consequence of the reduced surface electric field effect which enhances the current driving capability and reduces the Ron. Moreover, according to the embodiments of the present disclosure, the increased thickness of the gate dielectric layer over the drift region sustains the off-state breakdown voltage of the semiconductor devices. In addition, the lower electric field intensity boosts the reliability performance of the semiconductor devices of the present disclosure.

While compared the aforementioned embodiment of the present disclosure with the comparative example, it is observed that the Ron of the embodiment is reduced about 16.73% than the Ron of the comparative example. The off-state breakdown voltage of the embodiment is at the same level of the comparative example, for example about 20.80V to 21.04V. In addition, the saturation current of the embodiment is increased about 20.49% than that of the comparative example. Therefore, according to the embodiments of the present disclosure, the on-state resistance (Ron or Rdson) of the semiconductor devices is reduced. In addition, the saturation current (Idsat) of the semiconductor devices is increased. Meanwhile, the off-state breakdown voltage (VBD) of the semiconductor devices is sustained.

Figure 6:
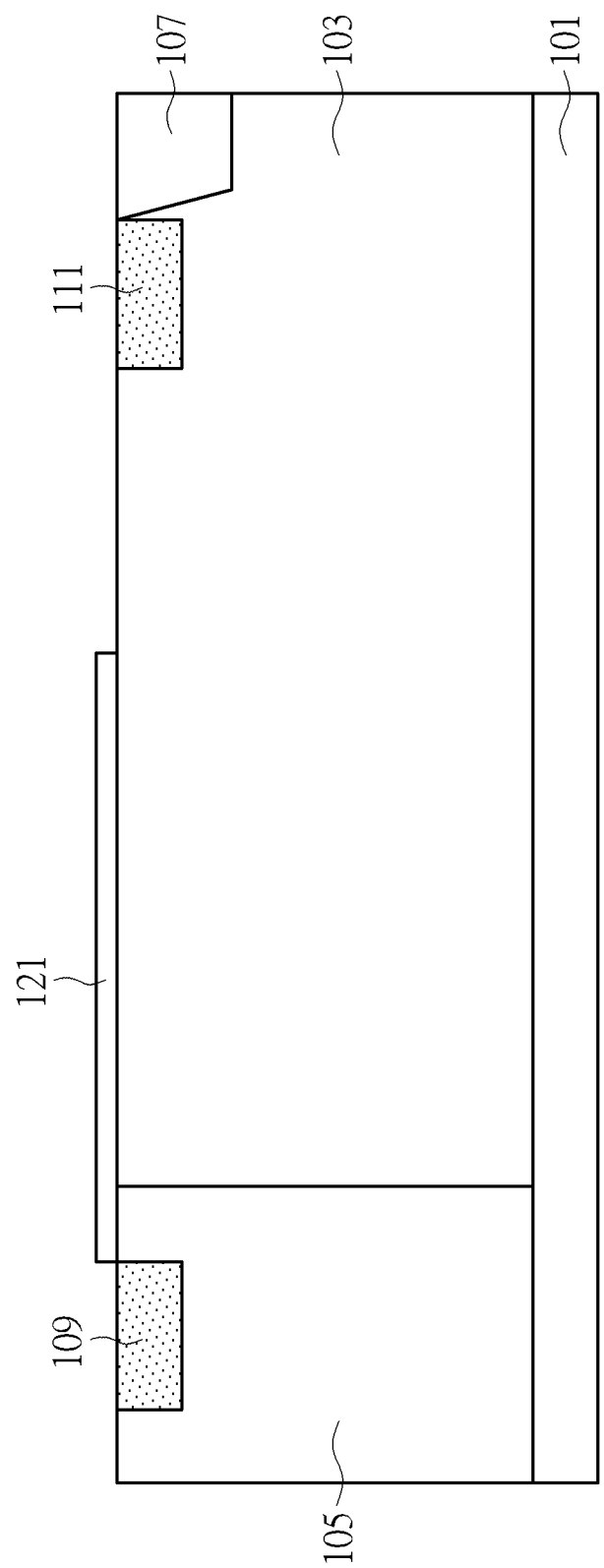
FIG. 6, FIG. 7, FIG. 8, FIG. 9 and FIG. 10 are schematic cross-sectional diagrams of several intermediate stages of fabricating a semiconductor device according to one embodiment of the present disclosure.

FIG. 6, FIG. 7, FIG. 8, FIG. 9 and FIG. 10 are schematic cross-sectional diagrams of several intermediate stages of fabricating a semiconductor device according to one embodiment of the present disclosure. Referring to FIG. 6, in some embodiments, after the well regions 103 and 105, the source region 109, the drain region 111 and the STI 107 are formed in the substrate 101, a first dielectric layer 121 is formed on the well regions 103 and 105, and between the source region 109 and the drain region 111. The first dielectric layer 121 may be formed by a deposition process and an etching process.

Figure 7:
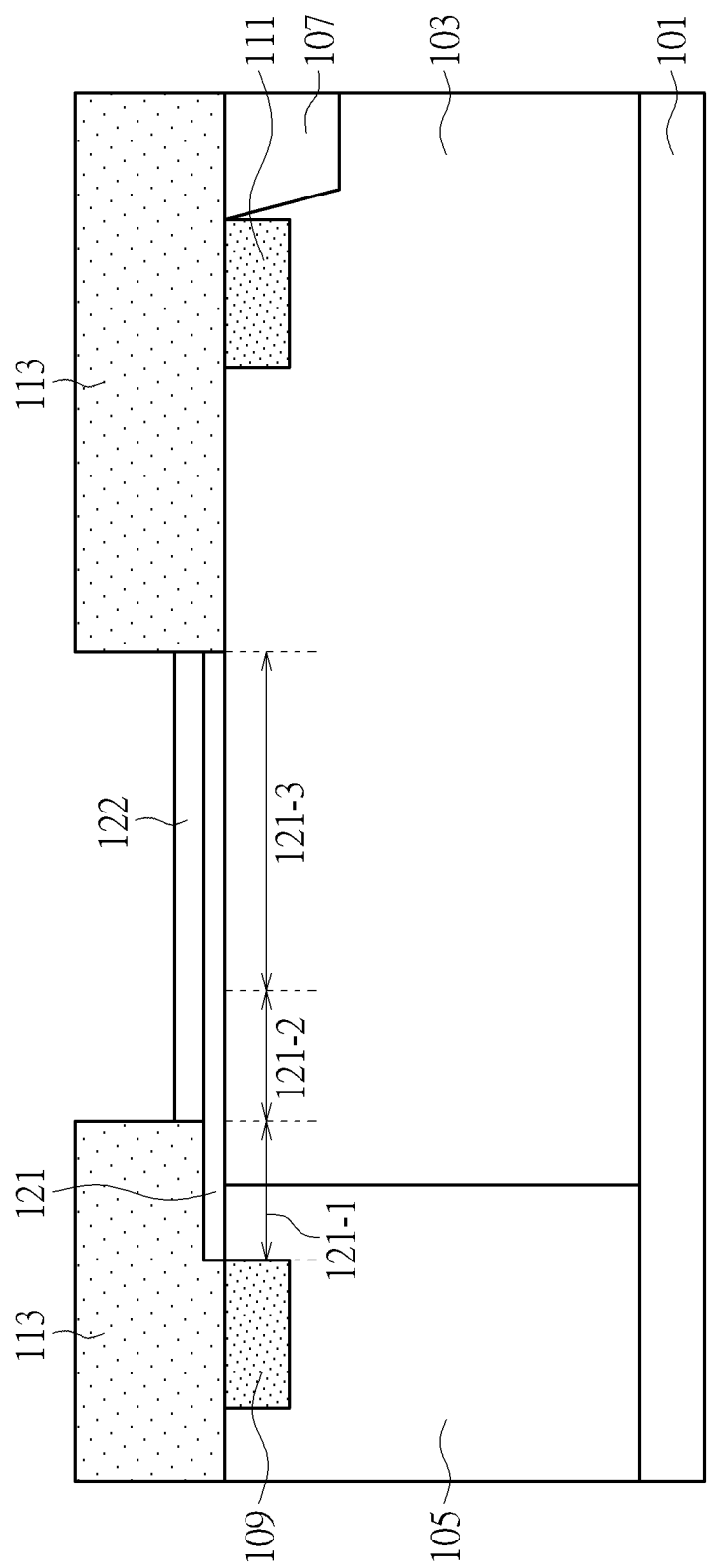

Next, referring to FIG. 7, in some embodiments, the first dielectric layer 121 includes a first region 121-1, a second region 121-2 and a third region 121-3. A patterned mask 113 is formed over the substrate 101 and covers the first region 121-1 of the first dielectric layer 121. The patterned mask 113 has an opening to expose the second region 121-2 and the third region 121-3 of the first dielectric layer 121. Then, in some embodiments, a second dielectric layer 122 is formed on the second region 121-2 and the third region 121-3 of the first dielectric layer 121 by a deposition process through the opening of the patterned mask 113.

Figure 8:
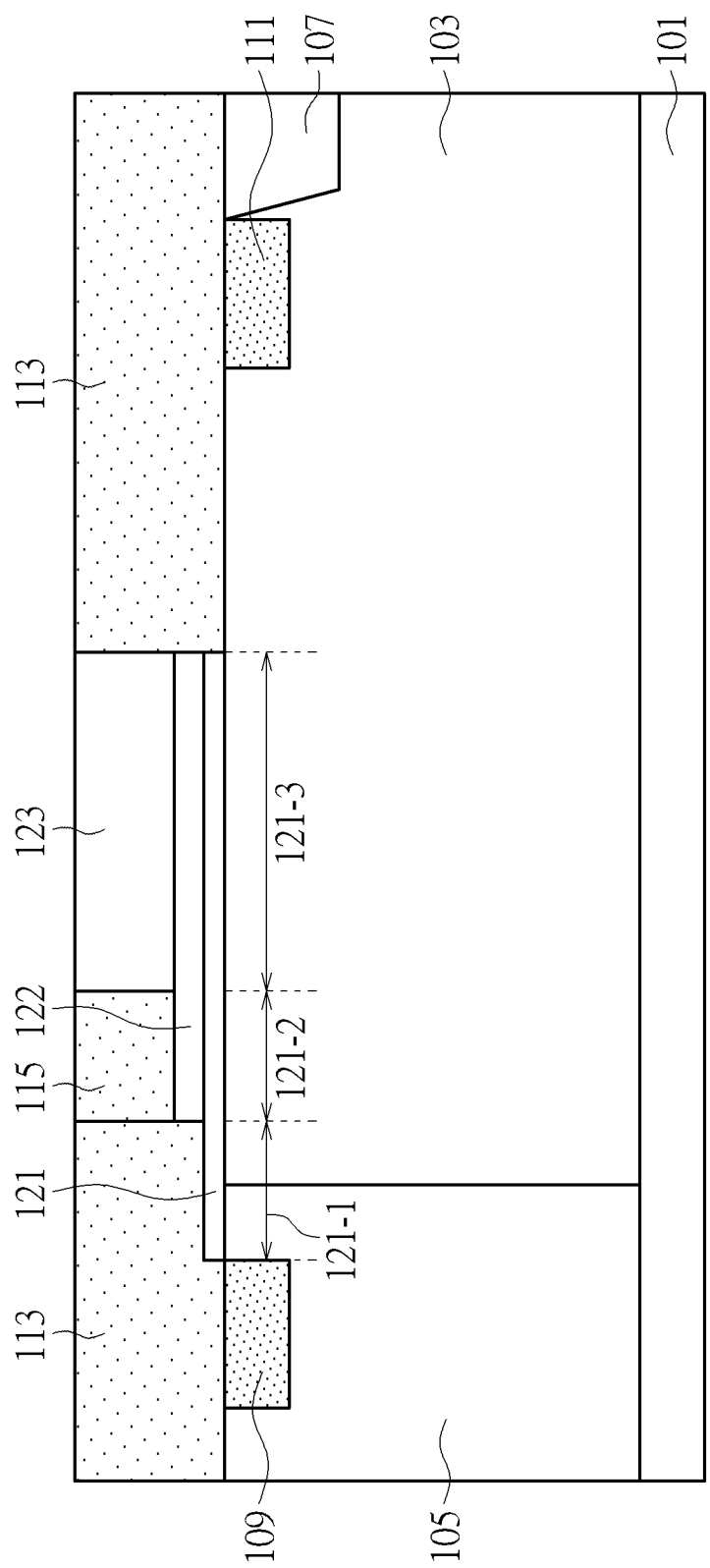

Thereafter, referring to FIG. 8, in some embodiments, another patterned mask 115 is formed on the second dielectric layer 122 at the second region 121-2 of the first dielectric layer 121. A third dielectric layer 123 is then formed on the second dielectric layer 122 at the third region 121-3 of the first dielectric layer 121 by a deposition process through an opening formed of the patterned mask 113 and the patterned mask 115.

In some embodiments, the first dielectric layer 121, the second dielectric layer 122 and the third dielectric layer 123 may be formed of the same material. In some other embodiments, the first dielectric layer 121, the second dielectric layer 122 and the third dielectric layer 123 may be formed of the materials that are different from each other. The materials of the first dielectric layer 121, the second dielectric layer 122 and the third dielectric layer 123 may include silicon oxide, silicon nitride, silicon oxynitride or a combination thereof. The deposition processes of forming the first dielectric layer 121, the second dielectric layer 122 and the third dielectric layer 123 are such as a CVD process, other applicable processes, or a combination thereof.

In some embodiments, the first dielectric layer 121 and the second dielectric layer 122 may have the same thickness. The thickness of the third dielectric layer 123 may be greater than that of the first dielectric layer 121 and the second dielectric layer 122. For example, the thicknesses of the first dielectric layer 121, the second dielectric layer 122 and the third dielectric layer 123 may be 80 Angstroms, 80 Angstroms and 300 Angstroms, respectively, but not limited thereto. Referring to FIG. 1 and FIG. 8, in some embodiments, the first portion 120-1 of the gate dielectric layer 120 is formed from the first region 121-1 of the first dielectric layer 121, the second portion 120-2 of the gate dielectric layer 120 is formed from the second region 121-2 of the first dielectric layer 121 and a portion of the second dielectric layer 122 thereon, and the third portion 120-3 of the gate dielectric layer 120 is formed from the third region 121-3 of the first dielectric layer 121 and another portion of the second dielectric layer 122 and the third dielectric layer 123 thereon.

Figure 9:
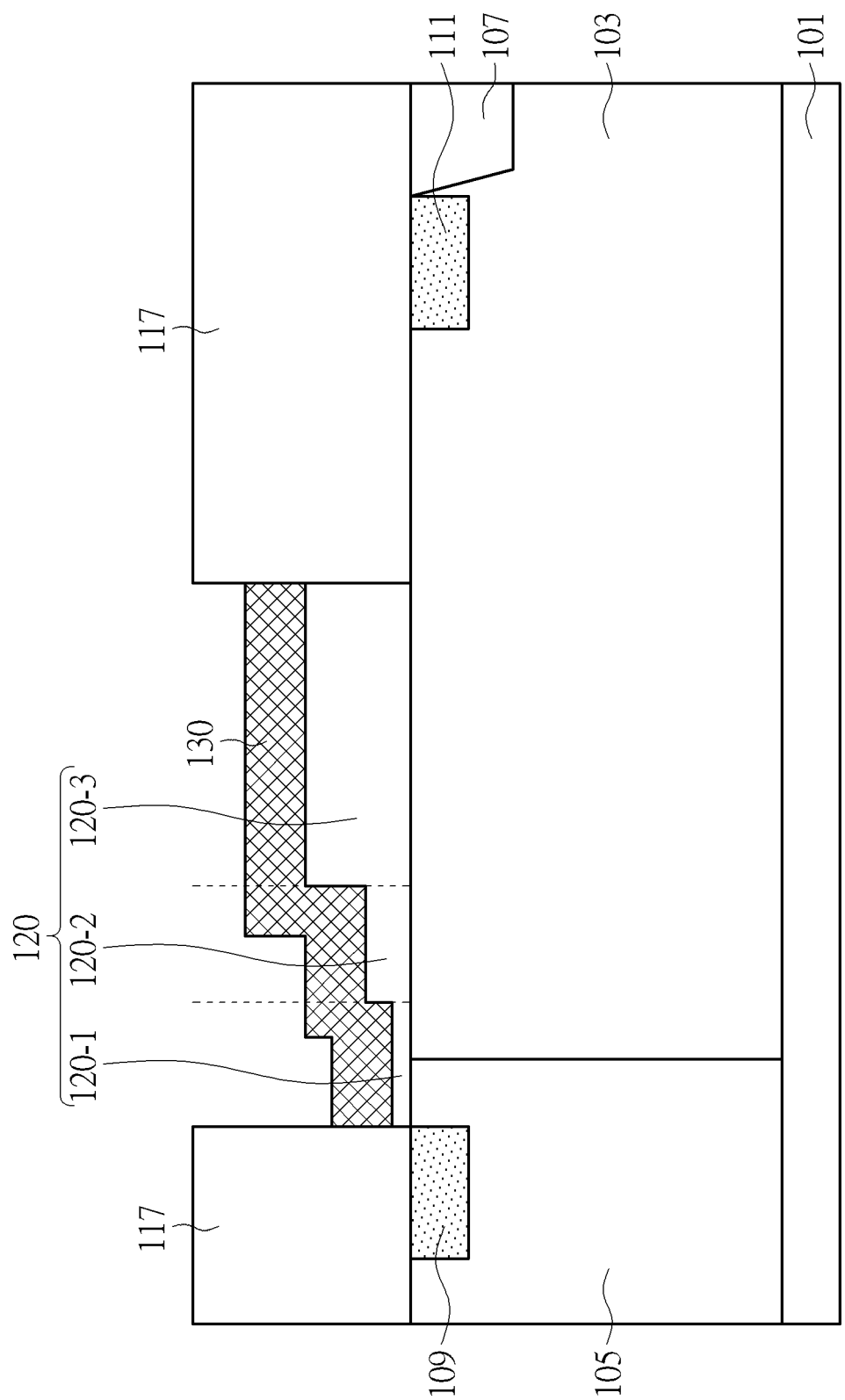

Next, referring to FIG. 9, in some embodiments, the patterned masks 113 and 115 are removed and then another patterned mask 117 is formed over the substrate 101. The patterned mask 117 has an opening to expose the gate dielectric layer 120. Thereafter, a gate material layer 130 is conformally deposited on the gate dielectric layer 120. The gate material layer 130 may be deposited by a CVD process (e.g., a low pressure chemical vapor deposition process (LPCVD), or a plasma enhanced chemical vapor deposition process (PECVD)), a PVD process (e.g., a resistive heating evaporation process, an e-beam evaporation process, or a sputtering process), an electroplating process, an ALD process, other applicable processes, or a combination thereof.

Figure 10:
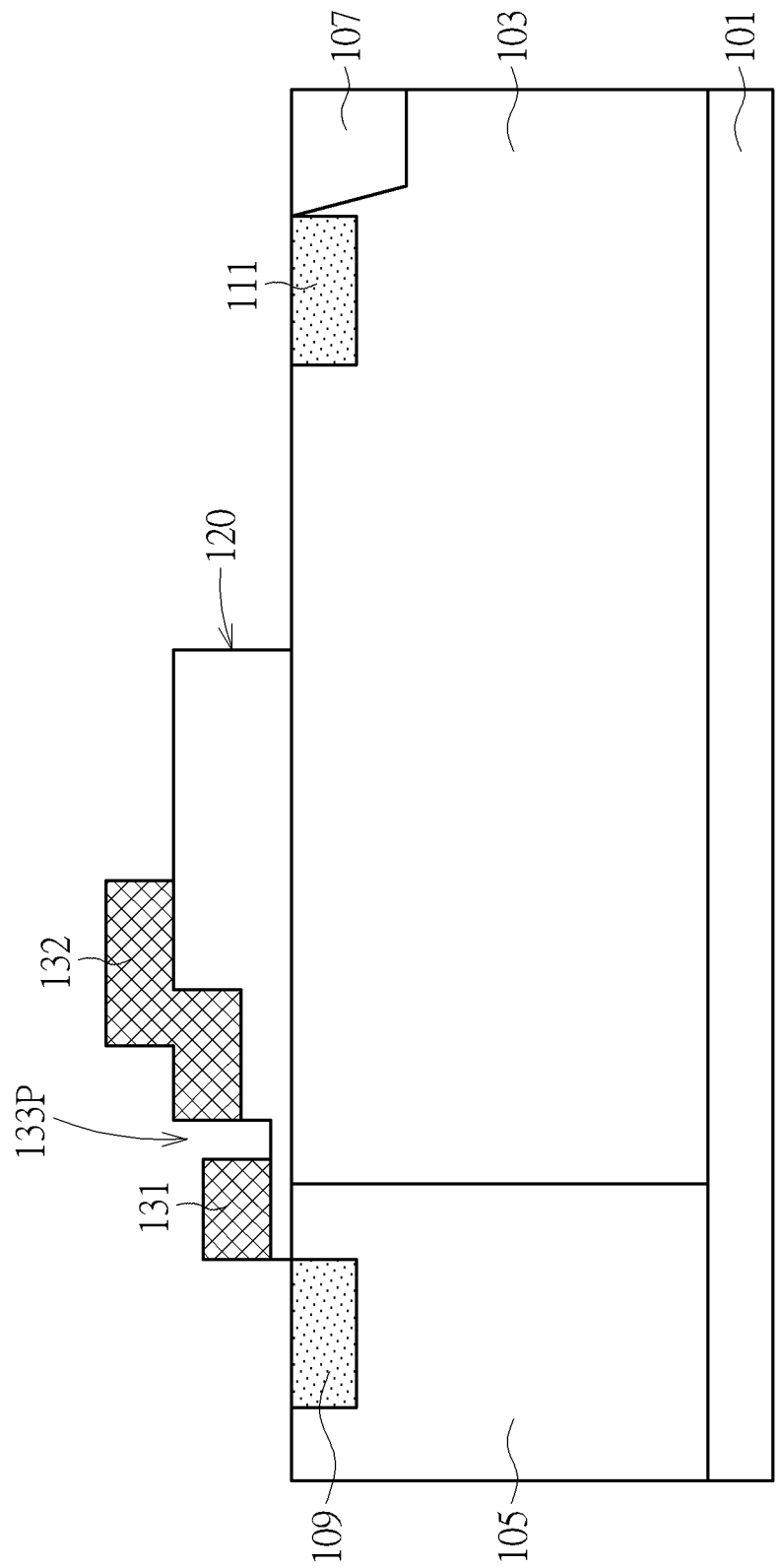

Referring to FIG. 10, in some embodiments, the gate material layer 130 is then patterned by a photolithography process and an etching process to form the gate electrode 131 and the field plate 132. The photolithography process is such as photoresist coating, soft baking, exposure, post-exposure baking, development, other applicable techniques, or a combination thereof. The etching process is such as a wet etching process, a dry etching process, other applicable techniques, or a combination thereof. According to the embodiments of the present disclosure, the gate electrode 131 and the field plate 132 are separated from each other by the gap 133P. In some embodiments, the gap 133P between the gate electrode 131 and the field plate 132 may be formed directly above the first portion 120-1 of the gate dielectric layer 120 as shown in FIG. 1. In some other embodiments, the gap 133P may be formed directly above the second portion 120-2 of the gate dielectric layer 120 as shown in FIG. 2. The position of the gap 133P and the lengths of the gate electrode 131 and the field plate 132 may be controlled by the patterned photoresist used in the photolithography process. Thereafter, the other features such as the gate spacers 135-1, 135-2 and 135-3, the ILD 140, the source electrode 142, the drain electrode 144 of FIG. 1, and other features are formed over the substrate 101 to complete the semiconductor device 100 of FIG. 1.

According to the embodiments of the present disclosure, the gate electrode and the field plate disposed on the gate dielectric layer of the triple step-shaped structure having three different thicknesses achieves sufficient reduced surface field (RESURF) effect that decreases the on-state resistance (Ron), increases the saturation current (Idsat) and sustains the off-state breakdown voltage of the semiconductor devices. The thinner first portion of the gate dielectric layer reduces the electric field intensity at the channel region which enhances current driving capability to reduce the Ron of the semiconductor devices of the present disclosure. The thicker second and third portions of gate dielectric layer release the electric field distribution which sustains the off-state breakdown voltage of the semiconductor devices of the present disclosure. In addition, the increased doping concentration profile at the drift region also enhances the current driving capability to reduce the Ron of the semiconductor devices of the present disclosure. Moreover, the lower electric field boosts reliability performance of the semiconductor devices of the present disclosure. Therefore, the electrical performances and reliability of the semiconductor devices according to the embodiments of the present disclosure are improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising: a substrate; a gate dielectric layer disposed on the substrate, wherein the gate dielectric layer includes a first portion having a first thickness, a second portion having a second thickness, and a third portion having a third thickness, and the first thickness, the second thickness and the third thickness are different from each other, and the first thickness is smaller than the second thickness and the third thickness; a gate electrode disposed on the first portion of the gate dielectric layer; a field plate disposed on and being in contact with top surfaces of both the second portion and the third portion of the gate dielectric layer, wherein the field plate is separated from and electrically coupled to the gate electrode; a source electrode disposed on one side of the gate electrode; and a drain electrode disposed on one side of the field plate.

2. The semiconductor device of claim 1, wherein the second thickness is smaller than the third thickness.

3. The semiconductor device of claim 1, wherein the first portion, the second portion and the third portion of the gate dielectric layer are connected with each other.

4. The semiconductor device of claim 1, wherein there is a gap between the gate electrode and the field plate, and the gap is directly above the first portion or the second portion of the gate dielectric layer.

5. The semiconductor device of claim 1, wherein the gate electrode and the field plate have the same electric potential.

6. The semiconductor device of claim 1, wherein the gate electrode has a first length and the field plate has a second length, and the second length is greater than the first length.

7. The semiconductor device of claim 1, wherein there is a first distance between the source electrode and the gate electrode, there is a second distance between the drain electrode and the field plate, and the second distance is greater than the first distance.

8. The semiconductor device of claim 1, wherein an edge of the field plate or an edge of the gate electrode is aligned with an edge of the second portion of the gate dielectric layer.

9. The semiconductor device of claim 1, wherein the third portion of the gate dielectric layer is protruded from the field plate towards the drain electrode, and there is a distance between the third portion of the gate dielectric layer and a drain region.

10. The semiconductor device of claim 1, further comprising:
a first gate spacer, disposed on one sidewall of the gate electrode;
a second gate spacer, filled in a gap between the gate electrode and the field plate; and
a third gate spacer, disposed on one sidewall of the field plate.

11. A method of fabricating a semiconductor device, comprising: providing a substrate; forming a gate dielectric layer on the substrate, wherein the gate dielectric layer includes a first portion having a first thickness, a second portion having a second thickness, and a third portion having a third thickness, and the first thickness, the second thickness and the third thickness are different from each other, and the first thickness is smaller than the second thickness and the third thickness; forming a gate electrode on the first portion of the gate dielectric layer; forming a field plate on and being in contact with top surfaces of both the second portion and the third portion of the gate dielectric layer, wherein the field plate is separated from and electrically coupled to the gate electrode; forming a source electrode on one side of the gate electrode; and forming a drain electrode on one side of the field plate.

12. The method of fabricating a semiconductor device of claim 11, wherein the second thickness is smaller than the third thickness.

13. The method of fabricating a semiconductor device of claim 11, wherein the first portion, the second portion and the third portion of the gate dielectric layer are connected with each other.

14. The method of fabricating a semiconductor device of claim 11, wherein forming the gate dielectric layer comprises:
forming a first dielectric layer on the substrate, wherein the first dielectric layer includes a first region, a second region and a third region;
forming a second dielectric layer on the second region and the third region of the first dielectric layer; and
forming a third dielectric layer on the second dielectric layer at the third region of the first dielectric layer.

15. The method of fabricating a semiconductor device of claim 14, wherein the first portion of the gate dielectric layer is formed from the first region of the first dielectric layer, the second portion of the gate dielectric layer is formed from the second region of the first dielectric layer and a portion of the second dielectric layer thereon, and the third portion of the gate dielectric layer is formed from the third region of the first dielectric layer and another portion of the second dielectric layer and the third dielectric layer thereon.

16. The method of fabricating a semiconductor device of claim 14, wherein the first dielectric layer, the second dielectric layer and the third dielectric layer are formed of the same material.

17. The method of fabricating a semiconductor device of claim 14, wherein the first dielectric layer, the second dielectric layer and the third dielectric layer are formed of materials that are different from each other.

18. The method of fabricating a semiconductor device of claim 11, wherein forming the gate electrode and the field plate comprises:
depositing a gate material layer on the gate dielectric layer;

patterning the gate material layer to form the gate electrode and the field plate, wherein a gap is formed between the gate electrode and the field plate.

19. The method of fabricating a semiconductor device of claim 18, wherein the gap is formed directly above the first portion or the second portion of the gate dielectric layer.

20. The method of fabricating a semiconductor device of claim 11, wherein the gate electrode has a first length and the field plate has a second length, and the second length is greater than the first length.

* * * * *